United States Patent

[11] 3,564,114

[72] Inventors Marvin Blinder
Union, N.J.;
Allen B. Chertoff, New York, N.Y.
[21] Appl. No. 684,882
[22] Filed Sept. 28, 1967
[45] Patented Feb. 16, 1971
[73] Assignee Said Blinder assor. to Loral Corporation
Scarsdale, N.Y.

[54] UNIVERSAL MULTILAYER PRINTED CIRCUIT BOARD
2 Claims, 8 Drawing Figs.

[52] U.S. Cl. .......... 174/68.5; 29/625; 317/101
[51] Int. Cl. .......... H05k 1/04
[50] Field of Search .......... 174/68.5; 317/101 (B), 101 (C); 29/625, 626; 156/3

[56] References Cited
UNITED STATES PATENTS

| | | | |
|---|---|---|---|
| 3,102,213 | 8/1963 | Bedson et al. | 174/68.5 |
| 3,243,498 | 3/1966 | Allen et al. | 174/68.5 |
| 3,319,317 | 5/1967 | Roche et al. | 174/68.5X |
| 3,344,515 | 10/1967 | Schuster et al. | 174/68.5X |

*Primary Examiner*—Darrell L. Clay
*Attorney*—Charles E. Temko

ABSTRACT: A prefabricated printed circuit board including a plurality of laminated planar-printed circuit-carrying members, each of the printed circuits having points of connection which are placed in congruent relation upon lamination, and having exposed planar surfaces which are covered over the entire area thereof with an etchable electrically conductive material such as copper. When employed to connect a specific group of components, the bonded layer is etched to a desired pattern, including points of electrical connection, following which the electrical components are mounted upon areas of the etched surface to be placed in electrical communication therewith.

PATENTED FEB 16 1971 3,564,114

SHEET 1 OF 7

Fig. 7
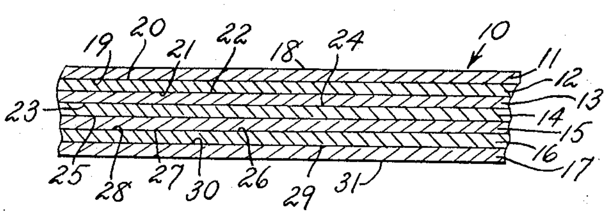
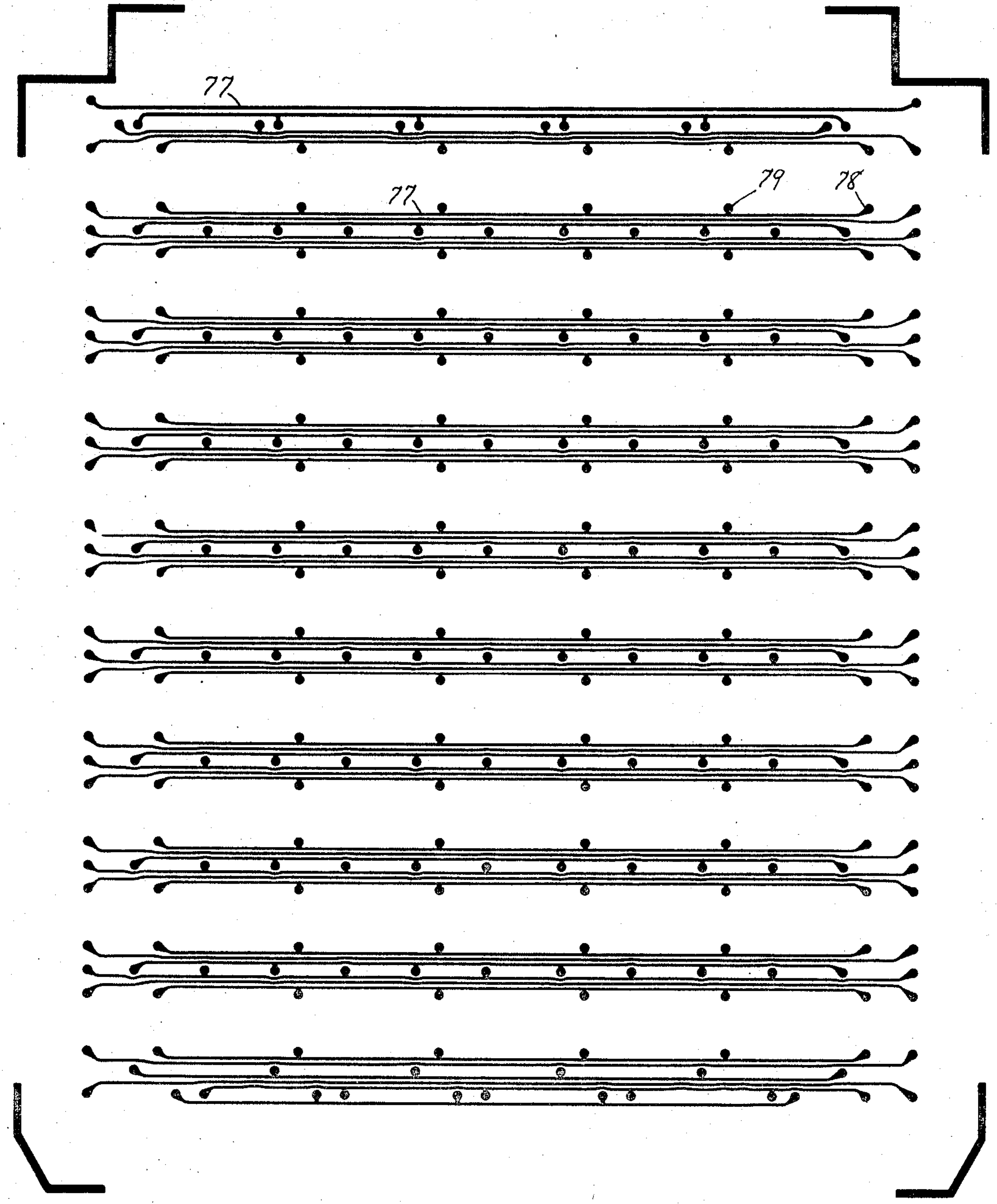
Fig. 6

UNIVERSAL MULTILAYER PRINTED CIRCUIT BOARD

This invention relates generally to the field of printed circuit board techniques, and more particularly to an improved multilayer printed circuit board and method of using the same.

It is known in the prior art to provide multilayer printed circuit boards for the interconnection of miniaturized and other electronic components. These boards are usually provided with pin terminal connections along one edge thereof, and enable individual sections of a complex electronic device to be assembled in the form of modular units.

It has been common practice in the prior art to design individually each of the laminar components of a multilayer board to suit an individual installation. Each of the lamina are prepared in the same manner, namely at least one surface thereof is covered with an etchable electroconductive material, such as copper, the plated surface is etched to a desired pattern, and finally the individual lamina are assembled in laminated condition prior to the installation of individual electronic components thereupon. This method is not only extremely costly, but leads to inaccuracies in fabrication, excessive tolerances in the case of closely spaced patterns, and substantial chances of error in the connection of individual lines. Moreover, once the board is laminated, the bulk of the circuits are no longer accessible, and should any line of conduction be broken, for one reason or another, the repair of the board requires the establishment of new circuits in accessible areas is often a complicated procedure.

It is therefore among the principal objects of the present invention to provide an improved multilayer printed circuit board which may be preassembled prior to allocation of any specific apparatus, whereby the necessity of designing a relatively large number of circuits is eliminated.

Another object of the invention lies in the provision of an improved multilayer printed circuit board employing standard printed circuit patterns on the internally disposed surfaces thereof, said patterns offering a plurality of conductive paths between a pair of given locations, whereby the external connection of components thereupon is facilitated.

Yet another object of the invention lies in the provision of an improved multilayer printed circuit board in which the cost of fabrication is materially reduced, as contrasted with prior art devices, thereby permitting consequent wide sale, distribution and use.

Still another object of the invention lies in the provision of an improved method for utilizing the disclosed multilayer printed circuit board, whereby mass production techniques may be fully utilized.

A feature of the invention lies in the fact that the disclosed embodiment may be fabricated using tools and techniques already existing in the art.

These objects and features, as well as other incidental ends and advantages, will more fully appear in the progress of the following disclosure, and be pointed out in the appended claims.

In the drawings, to which reference will be made in the specification, similar reference characters have been employed to designate corresponding parts throughout several views.

FIG. 6 is a schematic view showing a sixth printed circuit thereof.

FIG. 7 is an enlarged fragmentary transverse sectional view showing the individual laminae comprising the embodiment.

Figure 1:
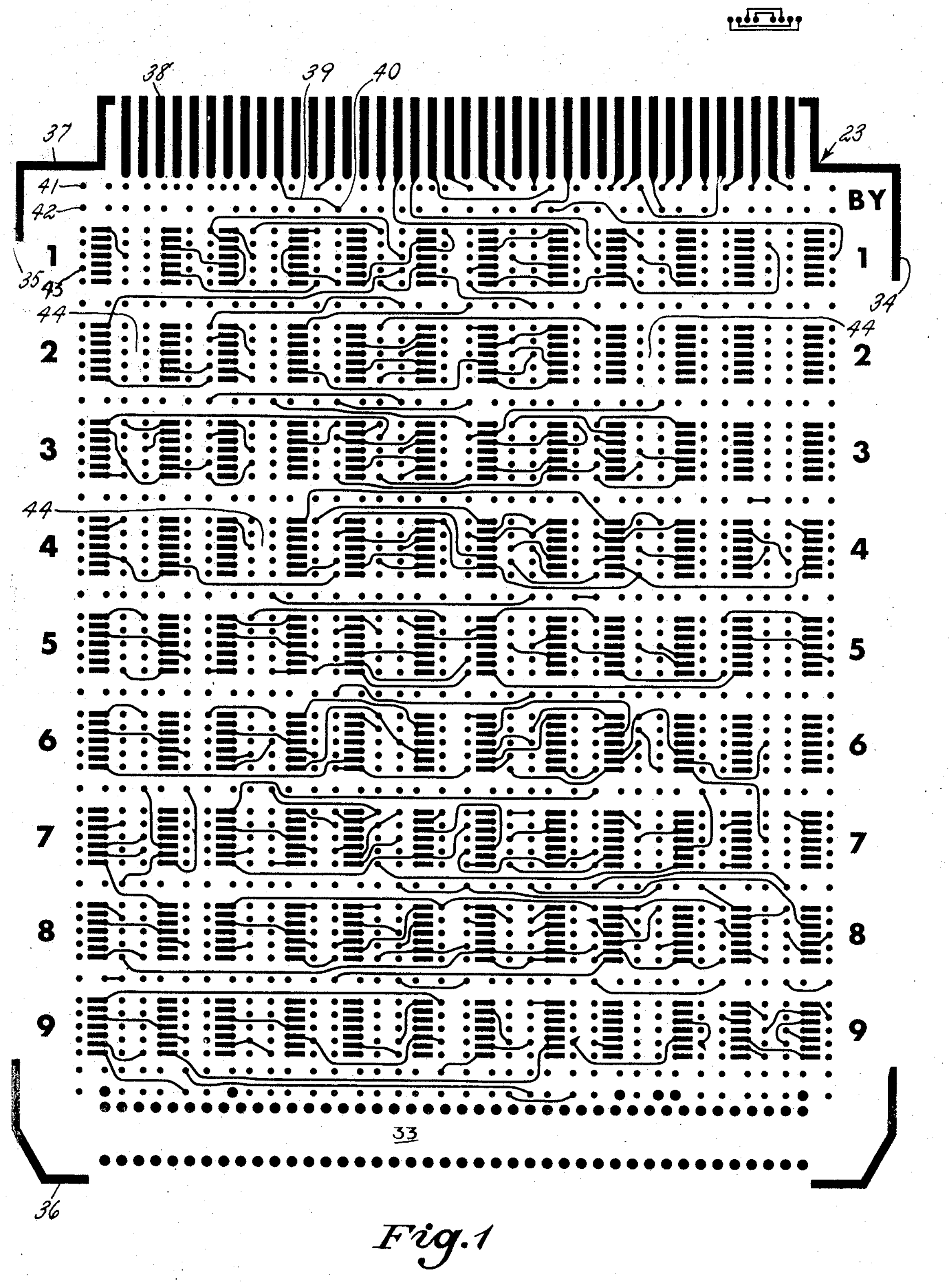
FIG. 1 is a schematic view showing a first printed circuit comprising a part of the disclosed embodiment of the invention.

Before entering into a detailed consideration of the disclosed embodiment, a brief description of the broader aspects of the invention is believed apposite.

As mentioned hereinabove, the common practice in the prior art in the manufacture of a modular electronic component employing a multilayer printed circuit board is to design a plurality of individual printed circuits which are each formed on an individual lamina, the circuits being placed in overlying relation upon assembly so that points of electrical connection are placed in congruent relation. The individual printed circuits are connected by drilling through the laminated board, and plating the bores formed thereby. The outer or exposed circuits are then plated and etched. Next the electronic components are mounted upon the exposed planar surfaces of the assembled board.

This practice requires the design of a large number of individual circuits, the design parameters of which depend upon the desired location and complexity of the individual components to be connected. With the design of each circuit, the chance of error is multiplied, and in cases where the laminated boards include as many as six laminae, the chance of error in connecting the individual circuits is relatively large. As each circuit is manufactured in relatively small lots, the cost, including design time, preparation of resists for etching, and the like is relatively high for each circuit actually made. Further, the circuits are normally designed to provide only one path of electrical communication for each desired connection, and upon the failure of any one of such paths, usually the entire modular assembly becomes useless until repaired. Repair is not easily accomplished once the board has been laminated, since the majority of the printed circuits are no longer accessible.

In the present invention, it is contemplated to use a number of standard printed circuits which are applied to the internally disposed laminae, the circuits being of such design as to afford a number of possible routes of communication between any two desired locations. As the patterns are standardized, no individual design of the same is necessary, and the boards may be laminated in advance of their actual use, to be kept in stock in varying sizes. As much larger numbers of the same may thus be manufactured, the cost per individual board is materially reduced.

The exposed planar surfaces of the board may be etched after assembly, and, accordingly, during manufacture they are covered over the entire area thereof with an etchable conductive material, such as copper. An individual circuit is designed for these surfaces and etched in accordance with connection requirements. The design of this circuit is materially simplified by the fact that there are already present immediately beneath any point of connection a plurality of routes, any of which may be conveniently connected from the outer surfaces of the laminated board, in accordance with convenience of connection, and other design criteria. Each of the individual predesigned circuits may be configured so as to have superior utility for a given purpose than others, and in using the circuit it is only necessary to drill through the laminated board in an area where the circuit is isolated for convenient connection. Thus, it is possible for the user to have available preprinted "-maps" which indicate the available routes on any given strata, to facilitate selection of a proper strata for an individual electrical connection. As these patterns are used many times, facility with their use is acquired and the chance of error in connection is accordingly reduced.

After assembly, should any individual connection become damaged, the modular unit employing the printed circuit board may be conveniently repaired by an examination of the defective connection, and the establishment of another connection between the same locations using an entirely different route without the necessity of disassembling the laminations comprising the printed circuit board.

With the foregoing discussion in mind, reference may now be made to FIG. 7 in the drawing, wherein the disclosed embodiment, generally indicated by reference character 10, comprises broadly first, second, third, fourth, fifth, sixth, and seventh individual laminated printing circuitbearing laminae of insulative fiberglass or other suitable synthetic resins well known in the art. These laminae are indicated, respectively by reference characters 11, 12, 13, 14, 15, 16 and 17.

The uppermost laminae 11 includes an exposed surface 18 which is covered over its entire surface with copper or other suitable etchable conductive material. The lower surface 19 is free of plating, and overlies the upper surface 20 of the second lamina 12. The upper surface 20 is provided with a previously etched or printed circuit shown in FIG. 2. The lower surface 21 thereof is unplated, and overlies the upper surface 22 of the third lamina 13.

Figure 3:
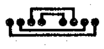
FIG. 3 is a schematic view showing a third printed circuit thereof.
Figure 3:
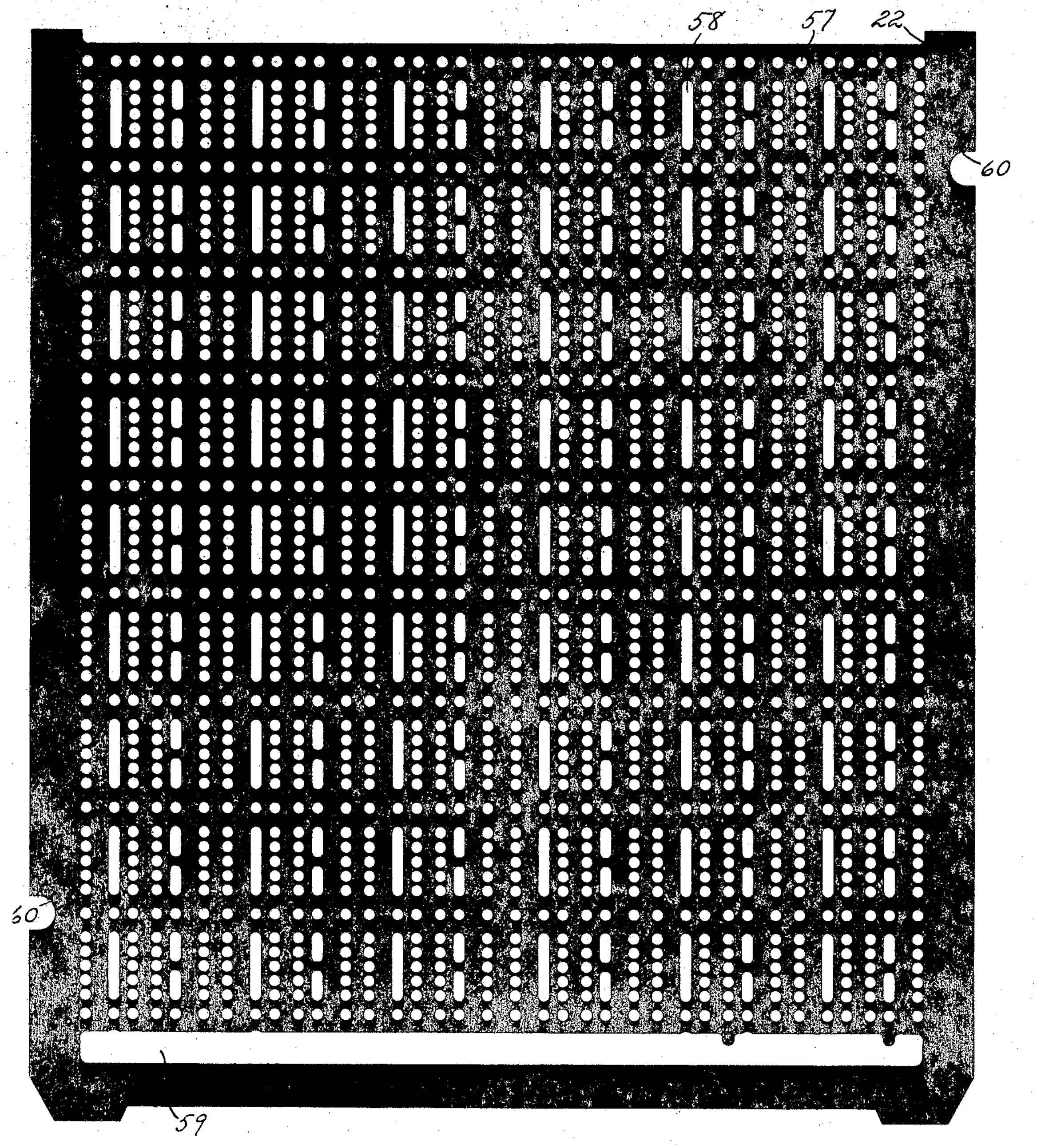

The surface 22 is already provided with a circuit illustrated in FIG. 3 in the drawing, while the surface 23 is left unplated to overlie the upper surface 24 of the fourth lamina 14. The surface 24 is similarly provided with a circuit illustrated in FIG. 4 in the drawing, the lower surface of the fourth lamina being clear to overlie the upper surface 26 of the fifth lamina 15.

Figure 5:
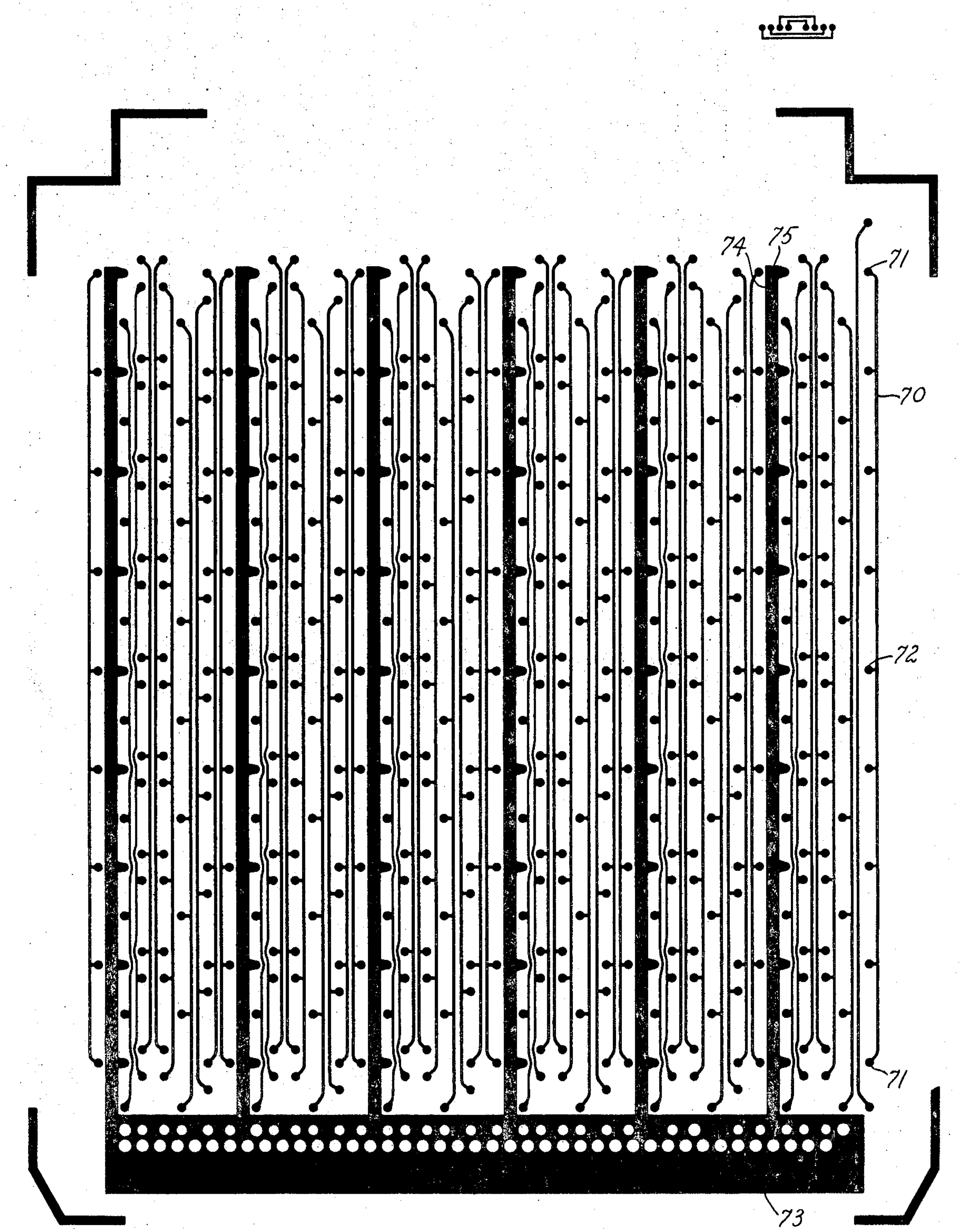
FIG. 5 is a schematic view showing a fifth printed circuit thereof.

The surface 26 is provided with a printed circuit corresponding to that seen in FIG. 5, and, in a similar manner, the lower surface 27 is clear of conductive material to overlie the upper surface 28 of the sixth laminae 16. The surface 28 is provided with a circuit corresponding to that seen in FIG. 6 in the drawing, the lower surface 29 being clear of conductive material and overlying the upper surface 30 of the sixth lamina 17.

The upper surface 30 is also clear of conductive material, however, the lower surface 31 is completely covered in a manner identical to that of the surface 18, so as to permit subsequent etching as required.

Referring to FIG. 1, there is illustrated an etched printed circuit, generally indicated by reference character 23 which is created upon the surface 18, and which is designed in accordance with a specific requirement. The circuit is of predetermined area, bounded by side edges 34 and 35, as well as end edges 36 and 37. The edge 37 accommodates a row of pin terminals 38, certain of which are connected by etched conductive paths 39 to terminals 40, as is known in the art. First and second rows 41 and 42 respectively of conductive terminals are preferably employed when it is desired to immediately transfer the circuit to another strata, that is to say where the connection will not be directly to a component (not shown) mounted upon the surface 33. Other terminals 43 are disposed in numbered rows, and permit selective connections with components mounted in the areas indicated by reference character 44 immediately adjacent thereto.

Figure 2:
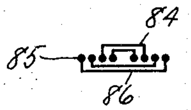
FIG. 2 is a similar schematic view showing a second printed circuit thereof.
Figure 2:
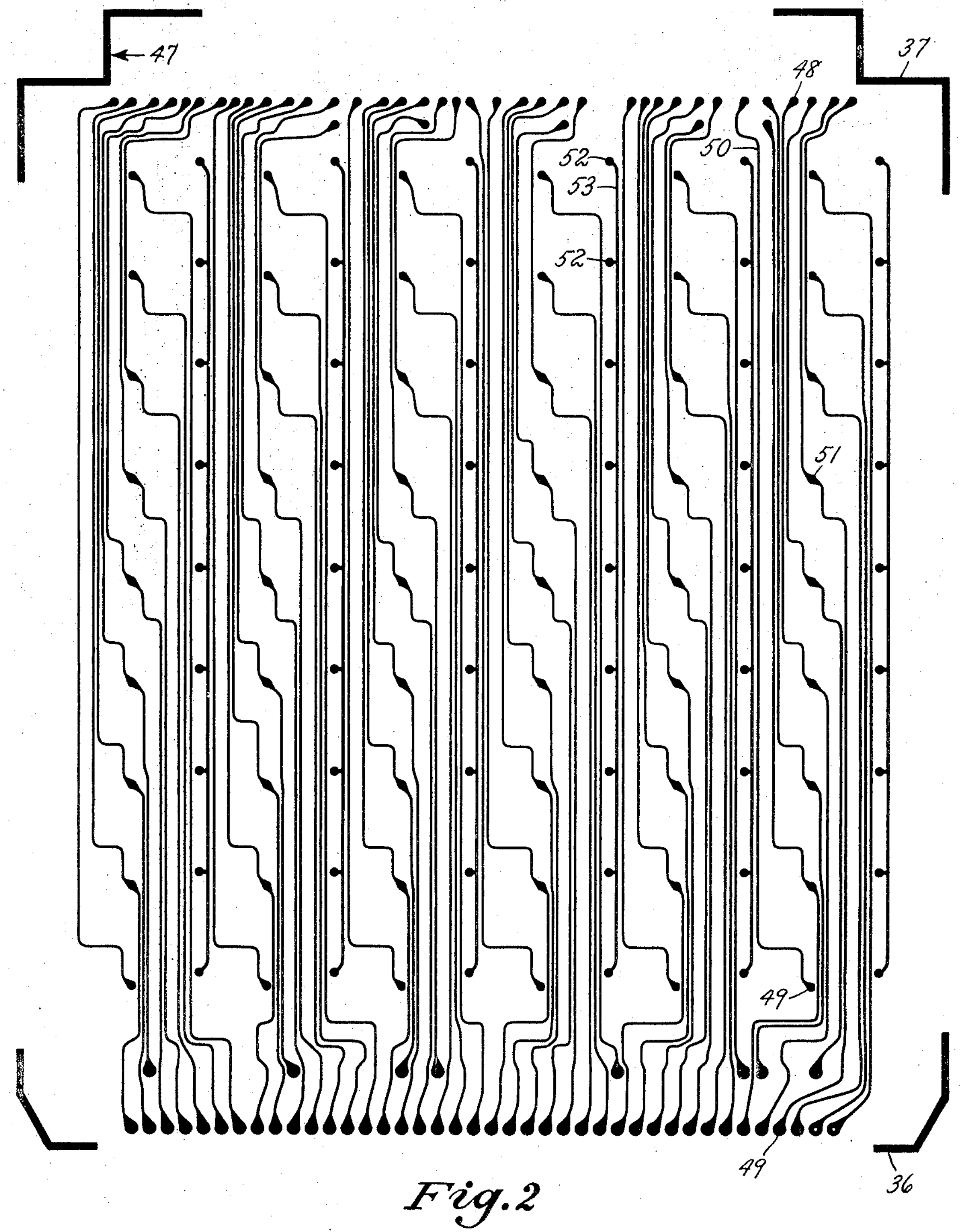

Referring to FIG. 2, the standard circuit, generally indicated by reference character 47 is designed to provide a strata in which paths may be established in a longitudinal direction between the end edges 36 and 37. Thus, there are provided a large number of end terminals 48, some of which communicate with corresponding second end terminals 49 through elongated conductors 50, and others of which communicate with intermediate terminals 51. In some cases, the intermediate terminals are also connected in series with other second end terminals 49. Supplementing the above possible connections are a plurality of aligned intermediate terminals 52 interconnected by rectilinear conductors 53.

Referring to FIG. 3 in the drawing, the surface 22 serves as a grounding strata, particularly adapted to the conduction of relatively heavy currents, and accordingly, the major area of the same is covered with conductive material. To permit passage of conductive routes through this strata, there is provided a plurality of clear circular areas 57, clear elongated areas 58, as well as a large generally rectangularly shaped area 59. Peripheral cutouts 60 are also provided for clearance near tooling holes.

Figure 4:
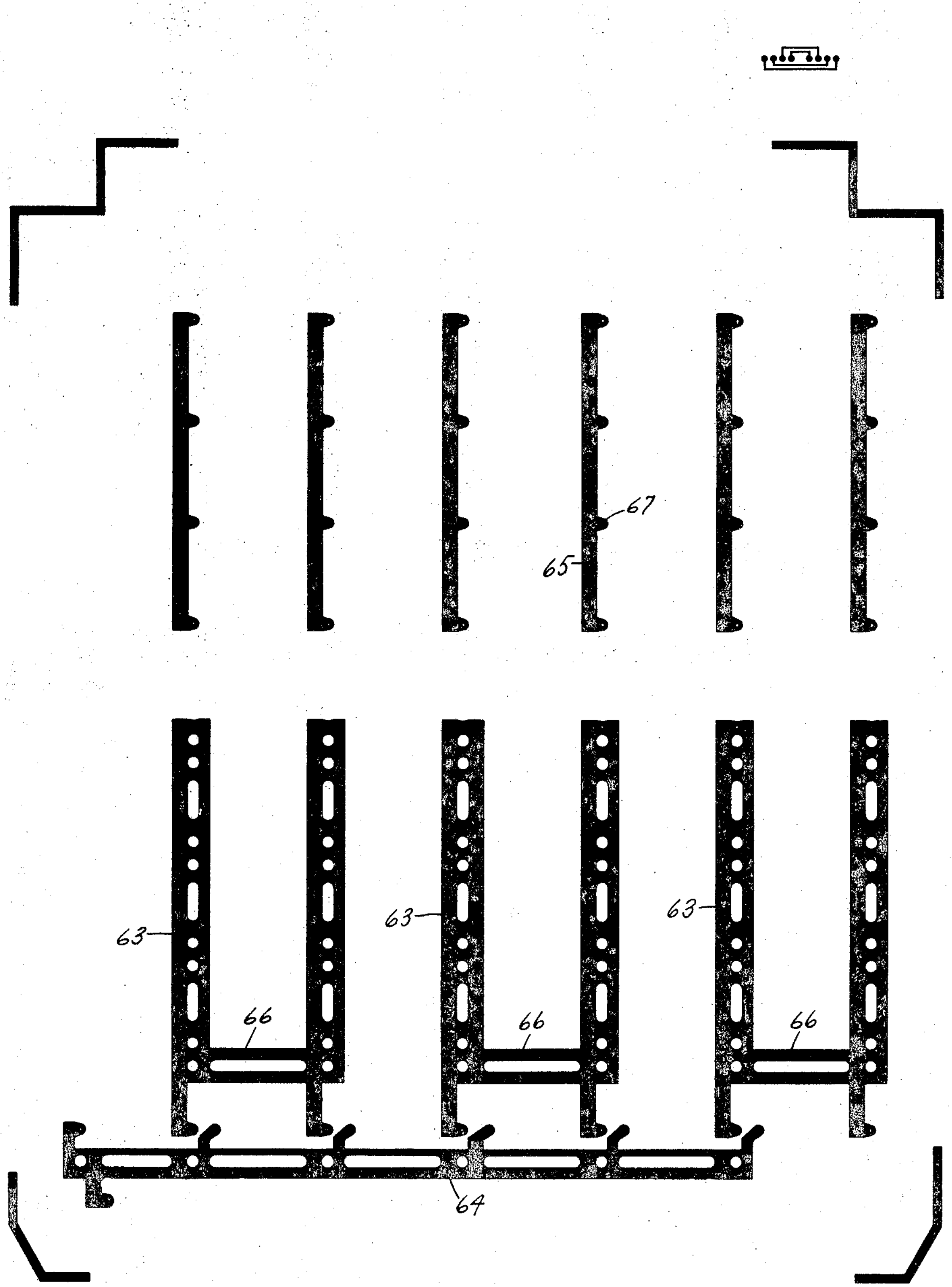
FIG. 4 is a schematic view showing a fourth printed circuit thereof.

Referring to FIG. 4, the surface 24 is particularly useful where a buss bar type of connection is required or desirable. It is also capable of conducting relatively heavy current loads. Accordingly, there is provided a plurality of elongated strips 63 having longitudinal parallel axes, an elongated laterally extending strip 64, and a plurality of conductive bars 65. The strips 63 are provided with transverse connecting strips 66 for connecting adjacent pairs thereof, while the bars 65 are provided with laterally extending terminals 67.

Reference is made to FIG. 5. This strata is adapted to combine the functions of that shown in FIG. 2, but with provision for carrying heavier current loads in predetermined areas. Accordingly, there are provided a plurality of intermediate longitudinal connecting means 70 each including terminal and intermediate connecting points 71 and 72, respectfully. At the lower end thereof there is provided a large bar 73 connected to the adjacent ends of a plurality of buss bars 74 each having laterally extending attaching points 75.

Referring to FIG. 6, this strata is concerned with establishing laterally oriented communication, and thus complements the strata illustrated in FIG. 2. A plurality of laterally extending conductors 77 are provided with terminal connecting points 78 as well as intermediate connecting points 79.

Figure 8:
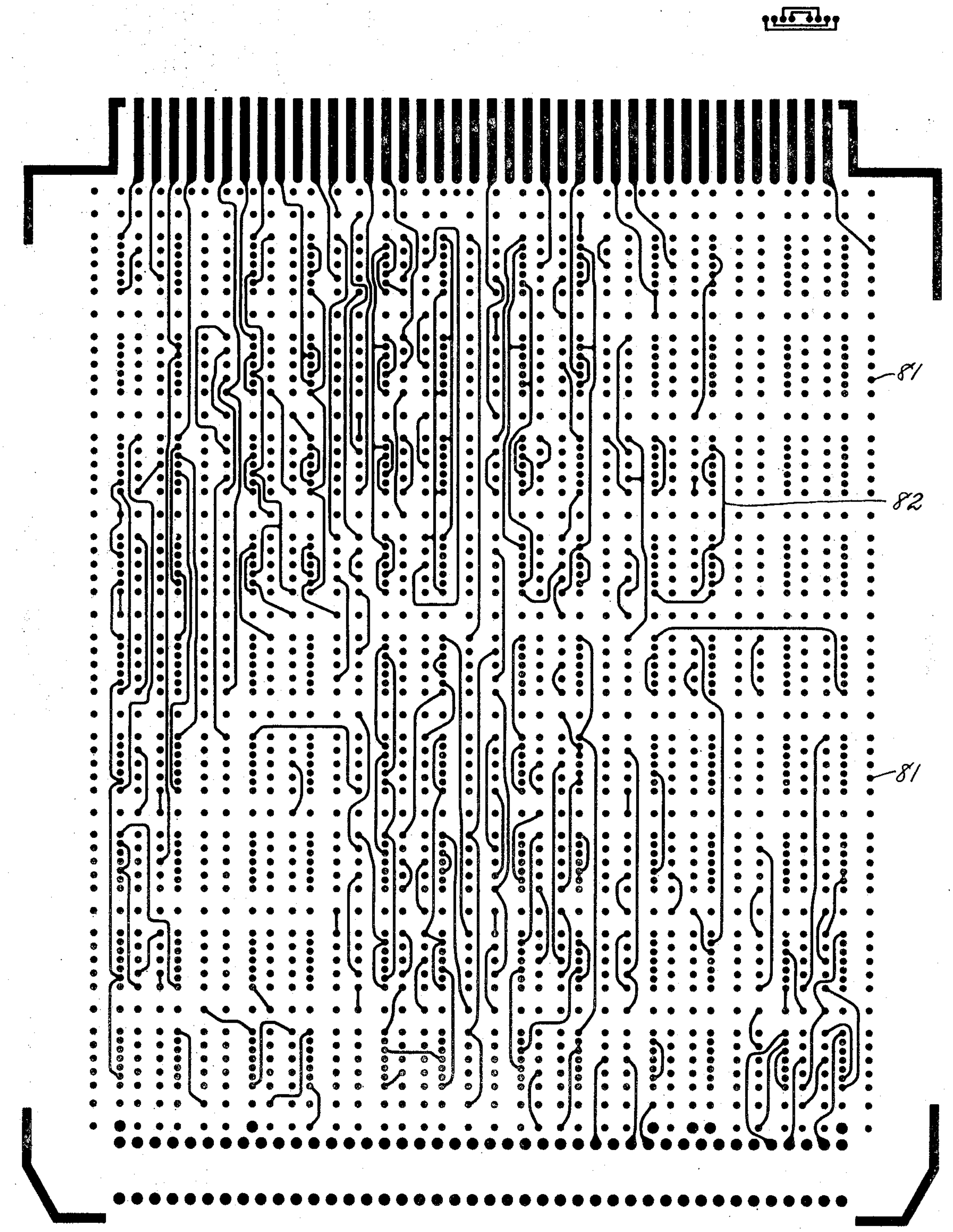
FIG. 8 is a schematic view showing a seventh printed circuit thereof.

Referring to FIG. 8, this strata is on surface 31 and is formed by etching at the same time as the strata shown in FIG. 1. It is used for forming externally disposed connections, and accordingly, includes a large number of terminals 81 and selected connecting lines 82.

From a consideration of FIGS. 1 to 6, inclusive, and FIG. 8 it will be readily appreciated that the placing of the patterns in each strata in superimposed relation so that a large number of connecting points are placed in corresponding congruent relation provides in every localized area the possibility of a large number of routes leading to another localized area on the exposed surfaces 18 and 31. In determining which of the available routes to use, consideration may be given to the amount of current to be carried, the number of connections which must be made in the particular localized area concerned, as well as any other mandatory design criteria. Once the routes have been established, a drilling template is prepared and, for any given production run, the requisite number of preassembled boards are drilled and "plated through" using existing techniques known in the art. Similarly, the exposed printed circuit, of which FIG. 1 is exemplary is also designed, resists are fabricated, and the corresponding circuit is etched, following which the components may be installed thereon. Rather than design six separate circuits, in accordance with the prior art, it has been necessary to design one, or at most two such circuits, the remaining internally disposed circuits being always the same, it being necessary to use only selected portions thereof.

To assure that the prefabricated boards have been properly assembled, it is convenient to provide each lamina with a test coupon, indicated in each of the FIGS. by reference character 84. The coupon consists of a plurality of terminals 85 selectively interconnected by conductors 86, and are disposed in congruent relation when the device 10 is properly assembled. Thus, to test an individual board, the connections of which correspond to a preestablished relationship, a sample drilling can be made through any of the terminals 84 which correspond, and conductivity then tested. As the bore formed by the drilling is not plated, each strata may be individually contacted to establish its presence.

We claim:

1. As a new article of manufacture, a prefabricated multilayer printed circuit board comprising: a plurality of insulative laminae, each of said laminae having first and second planar surfaces, at least one of said first and second surfaces of each of said laminae having a printed circuit area thereon, said at least one surface including a preestablished pattern of conductive material including a plurality of enlarged similarly shaped points of connection of such material for establishing electrical communications with components mounted on said board; said at least one surface being free of any conductive material in all areas outside said pattern, said laminae being physically laminated in mutually overlying relation to sandwich said patterns within the board and place said printed circuit areas in congruent relation in which at least some of said points of connection on each printed circuit being disposed along common axes perpendicular to the principal planes of said laminae, an outermost laminae of said board having an exposed surface, said exposed surface being covered with an etchable conductive material over substantially the entire area thereof and insulated from said patterns; at least one of said preestablished patterns having points of connection which are interconnected by lines of conductive materials extending principally in a first direction parallel to one edge of said laminae, another one of said laminae having a second pattern having points of connection which are interconnected by lines of conductive material extending principally in a direction at right angles relative to said first direction, a substantial number of the points of each of said preestablished pattern being aligned with the lines of interconnection connecting a substantial number of said points of connection, said interconnected points of connection of said first and second patterns overlying each other whereby a hole drilled through the laminae containing said patterns at one of the points of connection will connect several points of the first pattern with several points of the second pattern, and further wherein the first and second patterns contain a comparatively large number of said points and interconnecting lines with respect to the size of the board, permitting the circuit board to be adapted to a great variety of circuits and repair of a broken line of interconnection by changing a component to new points of connection on the broken line said printed circuit board further characterized in the provision of an additional predetermined pattern comprised substantially of a conductive area extending over the entire surface thereof and having a plurality of openings defining small areas of nonconductivity, at least some of which are congruent with respect to points of interconnection in said first and second predetermined patterns.

2. Structure in accordance with claim 1, further characterized in the provision of a fourth predetermined pattern comprised substantially of relatively broad conductive lines extending in both said first and second directions.